United States Patent
Lee et al.

(10) Patent No.: US 11,132,081 B2
(45) Date of Patent: Sep. 28, 2021

(54) TOUCH CIRCUIT, TOUCH DISPLAY DEVICE AND DRIVING METHOD THEREOF

(71) Applicant: LG Display Co., Ltd., Seoul (KR)

(72) Inventors: DongHoon Lee, Daegu (KR); JunWook Yoo, Daegu (KR); Kyurag Lee, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/913,060

(22) Filed: Jun. 26, 2020

(65) Prior Publication Data

US 2021/0089155 A1 Mar. 25, 2021

(30) Foreign Application Priority Data

Sep. 20, 2019 (KR) .................. 10-2019-0115833

(51) Int. Cl.
| | |
|---|---|
| G06F 3/041 | (2006.01) |
| H01L 27/32 | (2006.01) |
| G06F 3/044 | (2006.01) |
| G09G 3/3266 | (2016.01) |
| H01L 51/52 | (2006.01) |

(52) U.S. Cl.
CPC .......... G06F 3/0412 (2013.01); G06F 3/0445 (2019.05); G09G 3/3266 (2013.01); H01L 27/323 (2013.01); H01L 51/5237 (2013.01)

(58) Field of Classification Search
CPC ..... G09G 3/3225; G06F 3/0412; G06F 3/044; G06F 3/0445
See application file for complete search history.

(56) References Cited

U.S. PATENT DOCUMENTS

| | | | |
|---|---|---|---|
| 2017/0220185 A1* | 8/2017 | Kurasawa | ............. G06F 3/0446 |
| 2019/0204982 A1* | 7/2019 | Peng | ..................... G06F 3/0416 |
| 2019/0294282 A1* | 9/2019 | Dun | ..................... G06F 3/0446 |
| 2020/0089350 A1* | 3/2020 | Han | ........................ G06F 3/044 |

* cited by examiner

*Primary Examiner* — Liliana Cerullo
(74) *Attorney, Agent, or Firm* — Polsinelli PC (57) ABSTRACT

A display panel includes an edge area having a rounded shape and a flat inner area in which a plurality of touch electrodes are disposed. A plurality of driving lines applying a touch driving signal to the plurality of touch electrodes are disposed in the display panel. A touch circuit outputs the touch driving signal applied to the edge area at a voltage level higher than a voltage level of the touch driving signal applied to the inner area.

20 Claims, 10 Drawing Sheets

|            | Inner area | Horizontal edge area | Vertical edge area | Corner area |
|------------|------------|----------------------|--------------------|-------------|
| X          | 66pxl      | 66pxl                | 60pxl              | 60pxl       |
| Y          | 66pxl      | 78pxl                | 66pxl              | 78pxl       |
| Area ratio | 100%       | 121%                 | 90%                | 107%        |
| Cm(pF)     | 0.501      | 0.506                | 0.465              | 0.419       |

TOUCH CIRCUIT, TOUCH DISPLAY DEVICE AND DRIVING METHOD THEREOF

CROSS-REFERENCE TO RELATED APPLICATION

This application claims priority from Korean Patent Application No. 10-2019-0115833, filed on Sep. 20, 2019, which is hereby incorporated by reference in its entirety.

BACKGROUND

Field of the Disclosure

The present disclosure relates to a touch display device and, more particularly, to a touch display device and a driving method that can obtain uniform touch sensitivity in an edge area, and a touch circuit of the touch display device.

Description of the Background

Along with the development of information society, demand for a variety of types of display devices for displaying images is increasing. In this regard, a range of display devices, such as liquid crystal display (LCD) devices, plasma display devices, and organic light-emitting diode (OLED) display devices, have recently come into widespread use.

Among such display devices, touch display devices provide touch-based user interfaces enabling users to intuitively and conveniently input data or instructions directly to devices, rather than using conventional data input systems, such as buttons, a keyboard, or a mouse.

To provide such touch-based user interfaces, touch display devices must be able to sense a touch performed by a user and accurately determine touch coordinates.

In this regard, among a variety of touch sensing methods, capacitance touch sensing for sensing a touch and determining touch coordinates on the basis of a change in capacitance occurring in a plurality of touch electrodes is commonly used.

However, in such a touch display device, touch electrodes may have different sizes depending on the shape of a display panel, the positions of the touch electrodes, or the like, such that unintended capacitance deviations may occur between the touch electrodes, thereby lowering touch sensitivity, which is problematic.

SUMMARY

Accordingly, the present disclosure provides a touch circuit, a touch display device, and a driving method that can obtain excellent touch sensitivity by preventing or reducing capacitance deviations between the touch electrodes, irrespective of the shape of the display panel or the positions of the touch electrodes.

In addition, the present disclosure provides a touch circuit, a touch display device, and a driving method that can obtain excellent touch sensitivity by preventing or reducing capacitance deviations between the touch electrodes, even in a case in which the touch electrodes have different sizes.

In addition, the present disclosure provides a touch circuit, a touch display device, and a driving method that can obtain uniform touch sensitivity by reducing deviations between the capacitance of a touch electrode located in an edge area of the display panel and the capacitance of a touch electrode located in the central area of the display panel.

The present disclosure is not limited to the aforementioned description, and other features not explicitly disclosed herein will be clearly understood by those having ordinary knowledge in the technical field, to which the present disclosure pertains, from the description provided hereinafter.

According to the present disclosure, a touch display device may include a display panel including an edge area having a rounded shape and a flat inner area in which a plurality of touch electrodes are disposed, wherein a plurality of driving lines applying a touch driving signal to the plurality of touch electrodes are disposed in the display panel; and a touch circuit outputting the touch driving signal applied to the edge area at a voltage level higher than a voltage level of the touch driving signal applied to the inner area.

In the touch display device according to the present disclosure, the edge area may include at least one selected from among a top horizontal line, a bottom horizontal line, a left vertical line, and a right vertical line of the display panel.

In the touch display device according to the present disclosure, the driving lines may extend in parallel to a direction in which the edge area extends.

In the touch display device according to the present disclosure, the voltage level of the touch driving signal applied to the edge area may be determined in consideration of at least one selected from among the shape of the edge area, an arrangement of the touch electrodes in the edge area, and a difference in capacitance between the inner area and the edge area.

In the touch display device according to the present disclosure, the voltage level of the touch driving signal applied to the edge area may be equal to or smaller than two times the voltage level of the touch driving signal applied to the inner area.

In the touch display device according to the present disclosure, the driving lines may be different from sensing lines, through which a touch sensing signal from the plurality of electrodes is delivered to the touch circuit.

In the touch display device according to the present disclosure, the driving lines may be the same as sensing lines, through which a touch sensing signal from the plurality of electrodes is delivered to the touch circuit.

In the touch display device according to the present disclosure, an encapsulation layer may be provided in the display panel, and the touch electrodes and the driving lines may be disposed on the encapsulation layer.

In the touch display device according to the present disclosure, at a point in time at which the scan signal is applied to touch electrodes located in the edge area, among the plurality of touch electrodes, the touch circuit may apply the touch driving signal to the corresponding touch electrodes.

According to the present disclosure, a method of driving a touch display device may include: sequentially outputting a scan signal to a display panel along a plurality of gate lines, wherein the display panel includes an edge area having a rounded shape and a flat inner area in which a plurality of touch electrodes are disposed, and a plurality of driving lines applying a touch driving signal to the plurality of touch electrodes are disposed in the display panel; and outputting the touch driving signal applied to the edge area at a voltage level higher than a voltage level of the touch driving signal applied to the inner area.

According to the present disclosure, a touch circuit may include: a touch driving signal output circuit outputting a touch driving signal to a display panel including an edge area having a rounded shape and a flat inner area in which a plurality of touch electrodes are disposed, with a plurality of driving lines applying the touch driving signal to the plurality of touch electrodes being disposed in the display panel, such that the touch driving signal applied to the edge area has a voltage level higher than a voltage level of the touch driving signal applied to the inner area; and a touch sensing signal receiver circuit receiving a touch sensing signal delivered from the plurality of touch electrodes along sensing lines to detect a touch and determine touch coordinates.

According to the present disclosure, capacitance deviations between the touch electrodes may be prevented or reduced, irrespective of the positions of the touch electrodes.

According to the present disclosure, touch sensing may be performed on the basis of accurate capacitance irrespective of the shape of the display panel.

According to the present disclosure, even in a case in which the touch electrodes have different sizes, excellent touch sensitivity may be obtained by preventing or reducing capacitance deviations between the touch electrodes.

According to the present disclosure, even in a case in which the touch electrodes have different sizes, excellent touch sensitivity may be obtained by preventing or reducing capacitance deviations between the touch electrodes.

According to the present disclosure, uniform touch sensitivity may be obtained by reducing deviations between the capacitance of a touch electrode located in a rounded area of the display panel and the capacitance of a touch electrode located in the central area of the display panel.

Advantageous effects of the present disclosure disclosed herein are not limited to those described above. Rather, other advantageous effects not explicitly disclosed herein may be obtained from the present disclosure disclosed herein, and such advantageous effects may be clearly understood by those having ordinary knowledge in the art from the following detailed description.

DESCRIPTION OF DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

The advantages and features of the present disclosure and methods of the realization thereof will be apparent with reference to the accompanying drawings and detailed descriptions of the present disclosure. The present disclosure should not be construed as being limited to the present disclosure set forth herein and may be embodied in a variety of different forms. Rather, these the present disclosure are provided so that the present disclosure will be thorough and complete, and will fully convey the scope of the present disclosure to those having ordinary knowledge in the technical field. The scope of the present disclosure shall be defined by the appended claims.

The shapes, sizes, ratios, angles, numbers, and the like, inscribed in the drawings to illustrate exemplary the present disclosure are illustrative only, and the present disclosure is not limited to the present disclosure illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise", "include", "have", and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as "on", "above", "under", "below", and "on a side of", are used herein for descriptions of relationships between one element or component and another element or component, one or more intervening elements or components may be present between the one and other elements or components, unless a term, such as "directly", is used.

When temporally relative terms, such as "after", "subsequent", "following", and "before" are used to define a temporal relationship, a non-continuous case may be included unless the term "immediately" or "directly" is used.

In descriptions of signal transmission, such as "a signal is sent from node A to node B", a signal may be sent from node A to node B via another node unless the term "immediately" or "directly" is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of exemplary the present disclosure of the present disclosure may be partially or entirely coupled or combined with each other and may work in concert with each other or may operate in a variety of technical methods. In addition, respective exemplary the present disclosure may be carried out independently or may be associated with and carried out in concert with other the present disclosure.

Hereinafter, a variety of the present disclosure will be described in detail with reference to the accompanying drawings.

Figure 1:
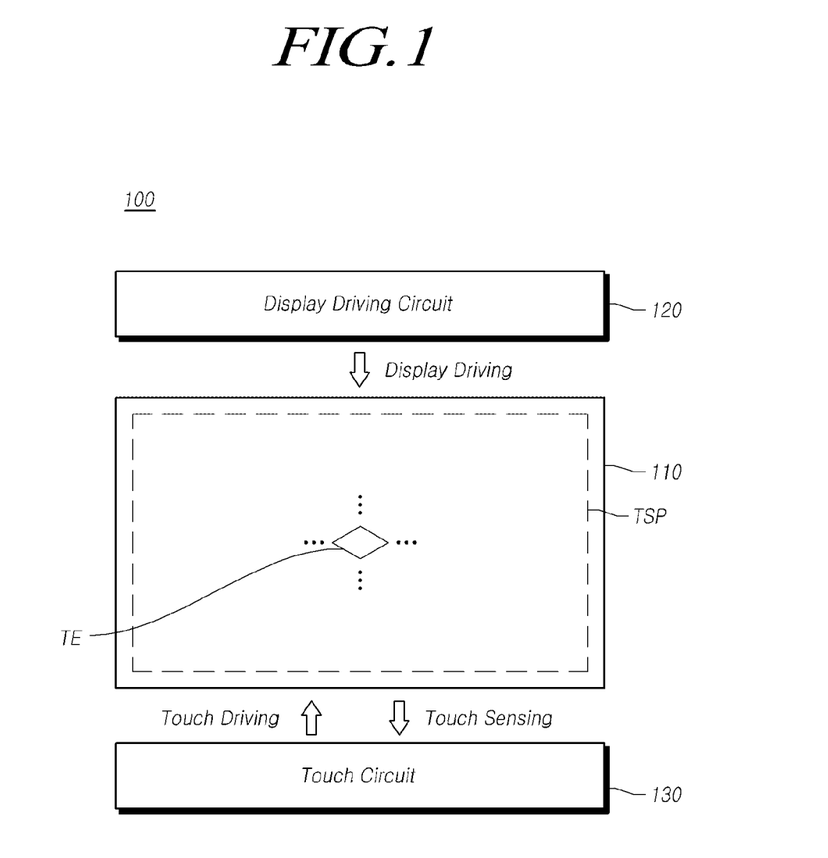
FIG. 1 is a diagram illustrating a system configuration of a touch display device according to the present disclosure.

FIG. 1 is a diagram illustrating a system configuration of a touch display device according to the present disclosure.

Referring to FIG. 1, the touch display device 100 according to the present disclosure may provide an image display function to display images and a touch sensing function to sense a user's touch.

The touch display device 100 may include a display panel 110 in which data lines and gate lines are disposed a display driving circuit 120 driving the display panel 110, and the like to display images.

In terms of functions, the display driving circuit 120 may include a data driver driving the data lines, a gate driver driving the gate lines, a controller controlling the data driver and the gate driver, and the like. The display driving circuit 120 may be implemented as one or more integrated circuits (ICs).

The touch display device 100 may include a touchscreen panel TSP in which a plurality of touch electrodes TE are disposed, a touch circuit 130 performing driving and sensing processing of the touchscreen panel TSP, and the like to enable touch sensing.

Here, the touchscreen panel TSP in the touch display device 100 may be an add-on touchscreen panel fabricated separately from the display panel 110 and bonded to the display panel 110 or an in-cell touchscreen panel fabricated together with the display panel 110 and present inside of the display panel 110. In the following description, the touchscreen panel TSP will be regarded as being an in-cell panel of the display panel 110.

The touch circuit 130 supplies a touch driving signal to the display panel 110 to drive the display panel 110, receives a touch sensing signal from the display panel 110, and on the basis of the touch sensing signal, detects a touch and determines touch coordinates.

The touch circuit 130 may include a touch driving circuit supplying the touch driving signal and receiving the touch sensing signal, a touch controller detecting the touch and determining the touch coordinates, and the like.

The touch circuit 130 may be implemented using one or more components (e.g. integrated circuits), and may be provided separately from the display driving circuit 120.

In addition, the entirety or a portion of the touch circuit 130 may be integrated with the display driving circuit 120 or the internal circuit of the display driving circuit 120. For example, the touch driving circuit of the touch circuit 130 may be provided as an integrated circuit together with the data driver of the display driving circuit 120.

In addition, the touch display device 100 may detect the touch and determine the touch coordinates on the basis of capacitance generated in the touch electrodes TE.

The touch display device 100 may perform touch sensing by a capacitance-based touch sensing method, such as mutual capacitance-based touch sensing or self capacitance-based touch sensing.

In the mutual capacitance-based touch sensing, the plurality of touch electrodes TE may be divided into driving electrodes to which the touch driving signal is applied through the driving lines Tx and sensing electrodes generating the touch sensing signal through sensing lines Rx and generating capacitance together with the driving electrodes. The driving lines Tx and the sensing lines Rx may be collectively referred to as the touch lines TL.

In the mutual capacitance-based touch sensing, the touch and the touch coordinates may be detected and determined on the basis of changes in the mutual capacitance occurring between the driving electrodes and the sensing electrodes, depending on the presence or absence of a finger, a pen, or the like.

In the self capacitance-based touch sensing, each of the touch electrodes TE serves as both a driving electrode and a sensing electrode. That is, the touch driving signal is applied to each of the touch electrodes TE, and the touch sensing signal is received through the touch electrodes TE to which the touch driving signal is applied. Accordingly, in the self capacitance-based touch sensing, there is no difference between the driving electrodes and the sensing electrodes.

In such self capacitance-based touch sensing, the touch and the touch coordinates are detected and determined on the basis of changes in capacitance occurring between a pointer, such as a finger or a pen, and the touch electrodes TE.

As described above, the touch display device 100 may perform the touch sensing by the mutual capacitance-based touch sensing or the self capacitance-based touch sensing.

Hereinafter, for the sake of brevity, a method for improving touch sensitivity will be described with reference to the touch display device 100 and the touch circuit 130 using the mutual capacitance-based touch sensing. However, such a method for improving touch sensitivity may also be applied to the touch display device 100 and the touch circuit 130 using the mutual capacitance-based touch sensing in the same manner.

Figure 2:
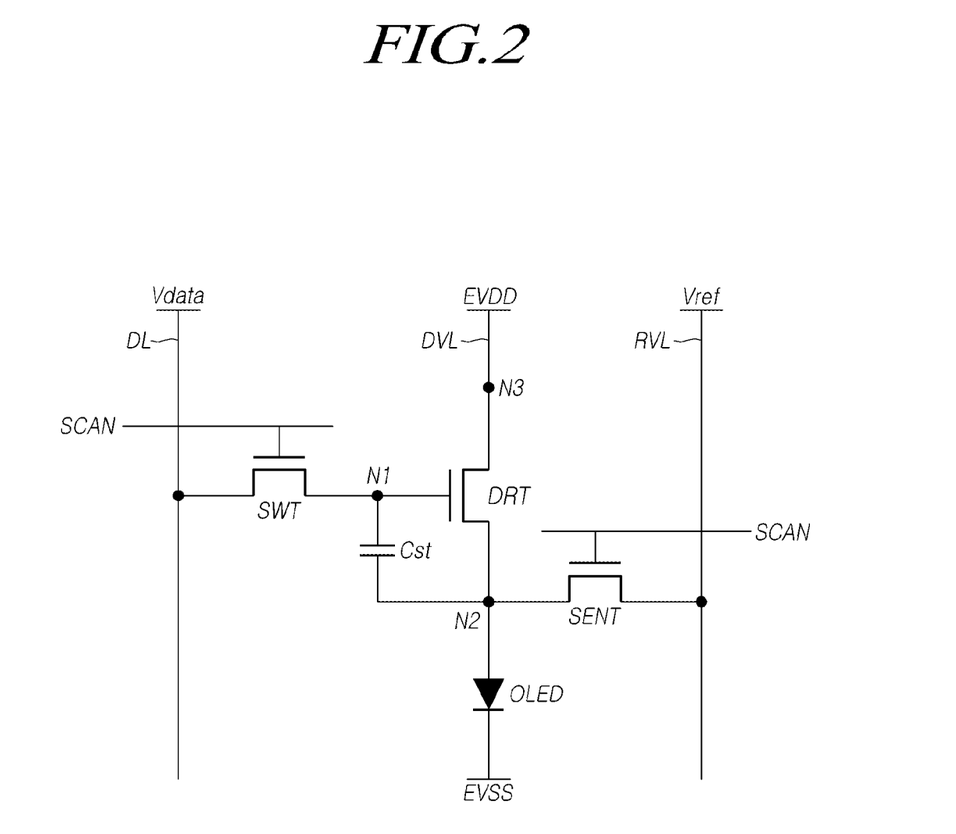
FIG. 2 is a circuit diagram illustrating a subpixel structure disposed in the touch display device according to the present disclosure.

FIG. 2 is a circuit diagram illustrating a subpixel structure disposed in the touch display device according to the present disclosure.

Referring to FIG. 2, the subpixel disposed in the touch display device according to the present disclosure includes an organic light-emitting diode OLED and a driving transistor DRT driving the organic light-emitting diode OLED.

A storage capacitor Cst may be electrically connected to a first node N1 and a second node N2 of the driving transistor DRT. A switching transistor SWT controlled by a scan signal SCAN may be electrically connected to the first node N1 of the driving transistor DRT and a corresponding data line DL. A sensing transistor SENT may be electrically connected to the second node N2 of the driving transistor DRT and a corresponding reference voltage line RVL.

The organic light-emitting diode OLED includes a first electrode (e.g. an anode or a cathode), an organic layer, and a second electrode (e.g. a cathode or an anode). For example, the first electrode of the organic light-emitting diode OLED may be connected to the second node N2 of the driving transistor DRT, and a base voltage EVSS may be applied to the second electrode of the organic light-emitting diode OLED.

The driving transistor DRT is a transistor driving the organic light-emitting diode OLED by supplying a driving current to the organic light-emitting diode OLED. The driving transistor DRT includes the first node N1 corresponding to a gate node, the second node corresponding to source node or a drain node, and a third node corresponding to a drain node or a gate node.

The switching transistor SWT is a transistor delivering a data voltage Vdata to the first node N1 of the driving transistor DRT. The switching transistor SWT may be turned on by the scan signal SCAN applied to the gate node to deliver the data voltage Vdata to the first node N1 of the driving transistor DRT.

The storage capacitor Cst is electrically connected to the first node N1 and the second node N2 of the driving transistor DRT to maintain a constant voltage for a one-frame period.

The sensing transistor SENT may be turned on by a signal applied to the gate node to apply a reference voltage Vref supplied through the reference voltage line RVL to the second node N2 of the driving transistor DRT. In addition, the sensing transistor SENT may be used to detect degradations of circuit components, such as the organic light-emitting diode OLED or the driving transistor DRT, included in the subpixel.

Such a touch display device 100 provides a function of detecting the user's touch on the display panel 110 displaying images and using the detected touch in input processing.

Figure 3:
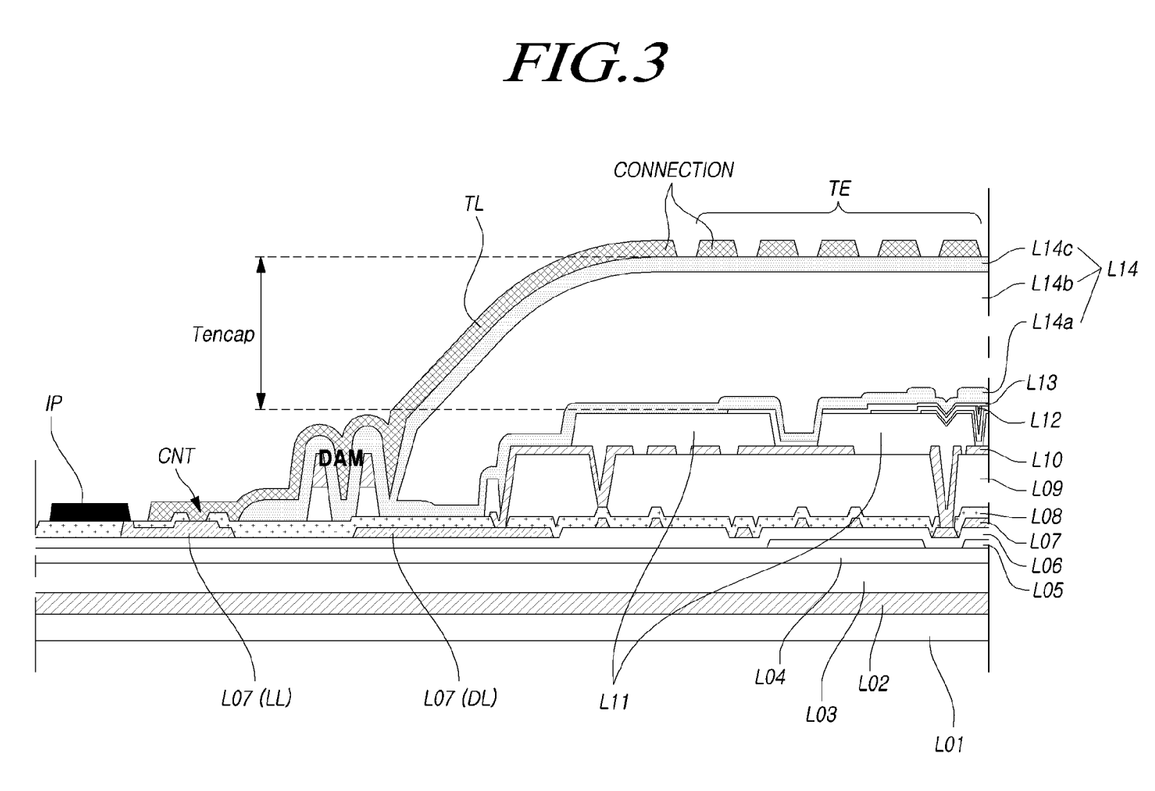
FIG. 3 is a cross-sectional view illustrating the display panel in the touch display device according to the present disclosure.

FIG. 3 is a cross-sectional view illustrating the display panel in the touch display device according to the present disclosure.

Referring to FIG. 3, in the display panel 110 of the touch display device 100 according to the present disclosure, a polyimide (PI) layer L02 is located on a substrate or back plate L01.

A buffer layer L03 may be located on the polyimide layer L02, and an interlayer insulating film L04 may be located on the buffer layer L03.

A gate layer L05 may be present on the interlayer insulating film L04, and gate electrodes or the like may be provided on necessary positions of the gate layer L05.

A gate insulating film L06 may be present on the gate layer L05.

A source/drain layer L07 may be present on the gate insulating film L06.

Signal lines, such as data lines DL and gate lines GL, and source/drain electrodes of a plurality of transistors may be provided on the source/drain layer L07.

A passivation layer L08 may be present on the source/drain layer L07.

A planarization layer L09 may be located on the passivation layer L08, and a first electrode layer L10 may be present on the planarization layer L09, in positions corresponding to the emission positions of the subpixels.

A bank layer L11 is located on the first electrode layer L10, and an organic light-emitting layer L12 is located on the bank layer L11.

A second electrode layer L13 commonly provided in all subpixel areas may be present on the organic light-emitting layer L12.

An encapsulation layer L14 may be present on the second electrode layer L13 to prevent infiltration of moisture, air, or the like.

A dam DAM may be present on a peripheral portion of the display panel 110.

The encapsulation layer L14 may be a single layer or a multilayer of two or more layers.

In addition, the encapsulation layer L14 may be a metal layer or a composite layer comprised of one or more organic material layers and one or more inorganic material layers.

Here, the encapsulation layer L14 is illustrated as being a multilayer comprised of a first encapsulation layer L14a, a second encapsulation layer L14b, and a third encapsulation layer L14c.

Each of the first encapsulation layer L14a, the second encapsulation layer L14b, and the third encapsulation layer L14c may be comprised of an organic material layer and an inorganic material layer.

The touch electrodes TE and the touch lines TL are provided on the encapsulation layer L14.

The touch electrodes TE and the touch lines TL provided on the encapsulation layer L14 may be electrically connected.

The touch lines TL electrically connected to the corresponding touch electrodes TE on the encapsulation layer L14 extend to areas without the touch electrodes TE so as to not overlap with the touch electrodes TE.

The touch lines TL bypass an area in which the dam DAM is located, and extend to an area outside of the dam DAM, i.e. an area adjacent to an integrated pad IP.

In addition, in the area outside of the dam DAM, the touch lines TL may be connected to the data lines DL on the source/drain layer L07 via contact holes CNT.

The data lines DL are electrically connected to the integrated pad IP present in the area outside of the dam DAM.

The touch lines TL and the touch electrodes TE may be located on the same layer or different layers while being located on the encapsulation layer L14.

The encapsulation layer L14 may have a predetermined thickness Tencap, which may have an influence on a time delay and touch sensitivity during the touch driving process and the touch sensing process.

Accordingly, the thickness Tencap of the encapsulation layer L14 must be designed in consideration of the time delay, the touch sensitivity, and the like due to the touch driving.

As described above, the display panel 110 according to the present disclosure may have a touch-on-encapsulation (TOE) structure in which touch sensor metal, such as the touch electrodes TE and the touch lines TL, is located on the encapsulation layer L14.

In addition, in this structure of the display panel 110, distances from the touch electrodes TE and the touch lines TL, provided on stepped portions of the planarization layer L09, to the second electrode layer L13 corresponding to the cathode decrease in the direction toward a rounded edge area. Such a decrease in the distances from the touch electrodes TE and the touch lines TL to the second electrode layer L13 may cause capacitance values in the edge area to be lower than those in the planar central area, so that touch sensitivity may be lowered.

Figure 4:
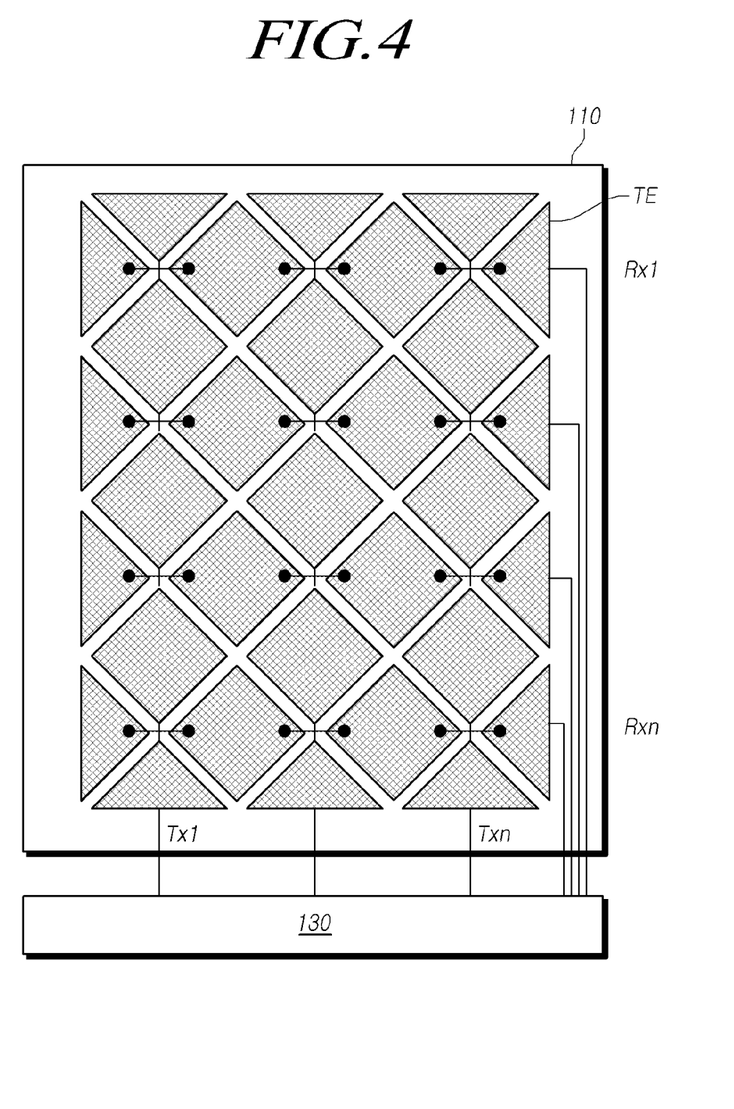
FIG. 4 is a plan view illustrating the display panel of the touch display device according to the present disclosure.

FIG. 4 is a plan view illustrating the display panel of the touch display device according to the present disclosure.

Referring to FIG. 4, the touch display device 100 according to the present disclosure includes the display panel 110 in which the plurality of touch electrodes TE and the plurality of touch lines TL are disposed and the touch circuit 130 outputting the touch driving signal to the touch electrodes TE and receiving the touch sensing signal from the touch electrodes TE.

The plurality of touch electrodes TE may be a plurality of divided electrodes disposed in the display panel 110, and are connected to the touch circuit 130 through the touch lines TL.

The touch lines TL may include the driving lines Tx, through which the touch driving signal output from the touch circuit 130 is applied to the touch electrodes TE, and the sensing lines Rx, through which the touch sensing signal is delivered from the touch electrodes TE to the touch circuit 130.

The driving lines Tx, through which the touch driving signal is delivered, may be disposed in a direction parallel to the data lines DL disposed in the display panel 110. The sensing lines Rx, through which the touch sensing signal is delivered, may be disposed in a direction parallel to the gate lines GL disposed in the display panel 110.

In general, the driving lines Tx may extend in the long-axis direction of the display panel 110, while the sensing lines Rx may extend in the short-axis direction of the display panel 110. However, the arrangement of the driving lines Tx and the sensing lines Rx may vary depending on the shape or structure of the touch display device 100.

The touch circuit 130 sequentially outputs the touch driving signal to the plurality of touch electrodes TE through the driving lines Tx in a touch sensing period.

In a case in which the touch driving signal is applied to the touch electrodes TE, a user's touch on the display panel 110 causes a change in the capacitance of the touch electrodes TE.

The touch circuit 130 may sense a change in the capacitance of the touch electrodes TE using the touch sensing signal received from the touch electrodes TE through the sensing lines Rx, thereby sense the user's touch on the display panel 110.

Here, since the display panel 110 simultaneously performs the display driving and the touch sensing, in a case in which the scan signal SCAN is applied to the gate lines GL disposed in the display panel 110, the touch driving signal may be applied and the touch sensing may be performed.

Figure 5:
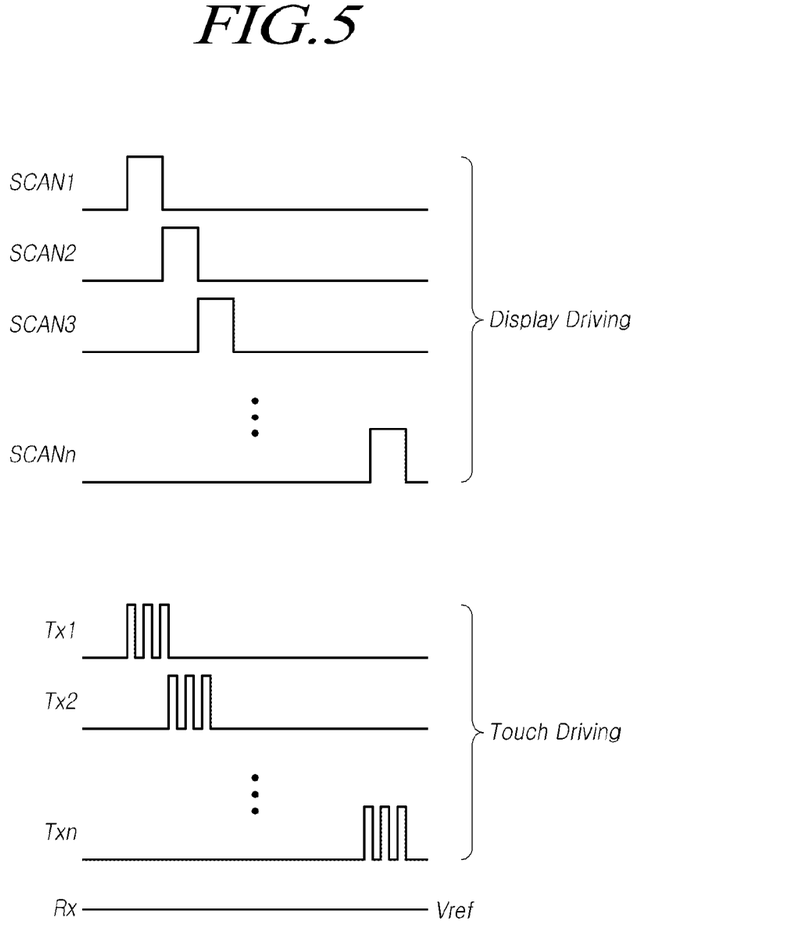
FIG. 5 is a timing diagram of a signal output by the touch display device for display driving and touch sensing.

FIG. 5 is a timing diagram of a signal output by the touch display device for display driving and touch sensing.

Referring to FIG. 5, the scan signal for display driving is sequentially output to the gate lines GL disposed in the display panel 110.

In addition, the touch driving signal for touch sensing is sequentially applied through driving lines Tx disposed in the display panel 110, in parallel to the data lines DL.

However, since the rounded edge area of the display panel 110 decreases the distances from the touch electrodes TE and the touch lines TL to the second electrode layer L13, the capacitance values in the edge area are lower than those of the central area, so that touch sensitivity is lowered.

Figure 6:
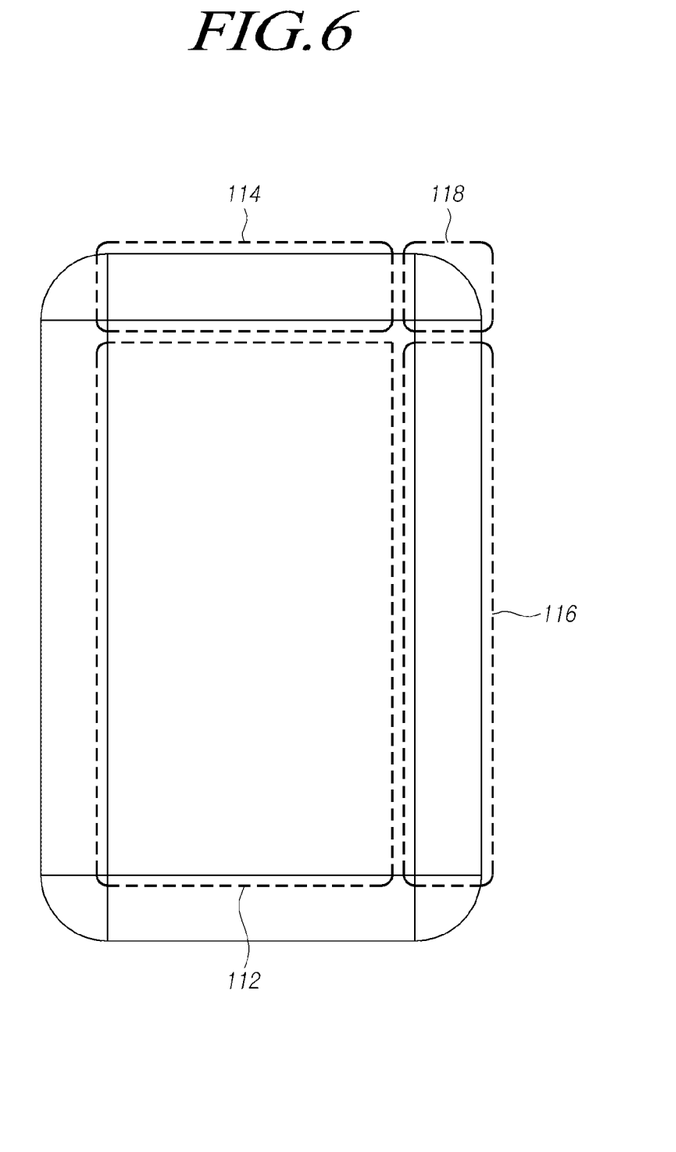
FIG. 6 is a diagram illustrating an area in which the touch electrodes are disposed in the display panel according to the present disclosure.

FIG. 6 is a diagram illustrating an area in which the touch electrodes are disposed in the display panel according to the present disclosure.

Referring to FIG. 6, the area in which the touch electrodes are disposed in the display panel 110 according to the present disclosure may include an inner area 112, a horizontal edge area 114, a vertical edge area 116, and a corner area 118.

The inner area 112 is the central area surrounded by the horizontal edge area 114 and the vertical edge area 116, and may be referred to as an area having a planar structure.

Therefore, since the distance from the touch electrodes TE and the touch lines TL to the second electrode layer L13 are uniform, capacitance values in the inner area 112 may appear uniform, in all positions.

The horizontal edge area 114 is an area located above or below the inner area 112. The horizontal edge area 114 generally has a flat planar structure, although the horizontal edge area 114 may have a rounded shape depending on the structure of the display panel 110 in some cases.

The vertical edge area 116 is an area extending in a vertical direction on the left or right of the inner area 112. The vertical edge area 116 may have a flat planar structure depending on the structure of the display panel 110. The vertical edge area 116 has a rounded shape in the touch display device 100 released recently. In a structure having a touch function, the vertical edge area 116 is curved at a predetermined curvature.

As described above, in a case in which the vertical edge area 116 is rounded, the distances from the touch electrodes TE and the touch lines TL to the second electrode layer L13 in the vertical edge area 116 are shorter than those in the inner area 112. Then, capacitance values in the vertical edge area 116 due to the touch sensing are lower than those in the inner area 112, thereby lowering touch sensitivity.

The corner area 118 is a corner area joining the horizontal edge area 114 and the vertical edge area 116. Although the corner area 118 may have a flat planar structure depending on the structure of the display panel 110, the corner area 118 may have a rounded shape, with a portion thereof being curved together with the rounded vertical edge area 116.

Although the corner area 118 is illustrated as being separate from the edge areas 114 and 116, the corner area 118 having a rounded shape may be regarded as being included in the horizontal edge area 114 or the vertical edge area 116 depending on the orientation of the rounded shape.

Figure 7:
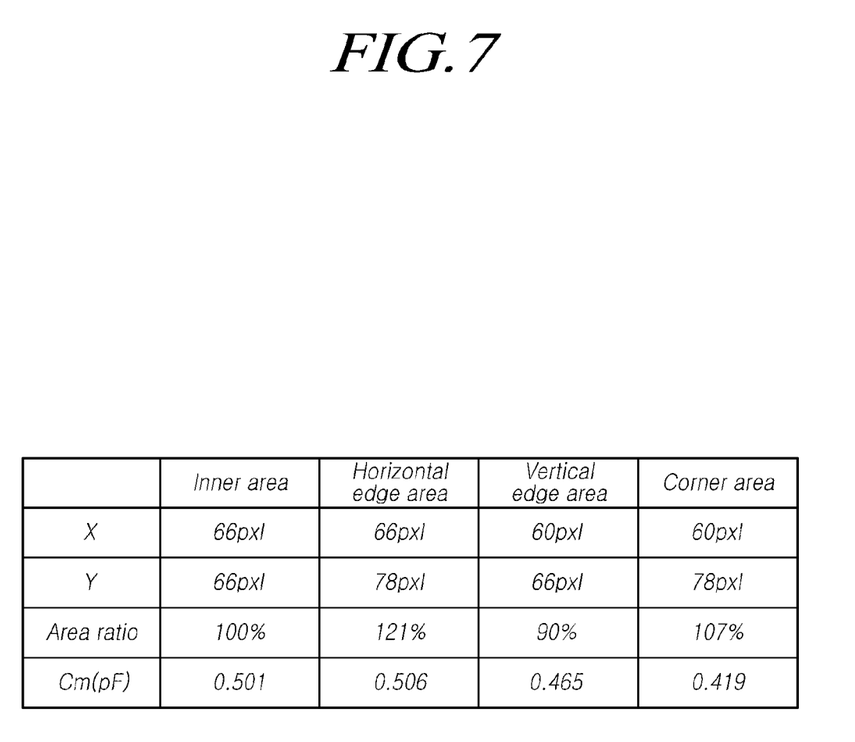
FIG. 7 is a table comparing capacitance values depending on the areas in which the touch electrodes are disposed in the display panel.

FIG. 7 is a table comparing capacitance values depending on the areas in which the touch electrodes are disposed in the display panel.

FIG. 7 illustrates values obtained by measuring capacitance values of the touch display device 100 extending in the vertical direction, with the left and right edge portions thereof being rounded, as illustrated in FIG. 6.

Referring to FIG. 7, the inner area 112, i.e. the central portion surrounded by the horizontal edge area 114 and the vertical edge area 116 has the same number of subpixels, i.e. 66 subpixels, in the horizontal direction X and the vertical direction Y of the touch electrodes TE. Therefore, it may be appreciated that the inner area 112 has an area ratio of 100% and a capacitance value Cm of about 0.501 pF.

In addition, in the horizontal edge area 114 located above or below the inner area 112, the number of subpixels in the vertical direction Y is 78, which is greater than the number 66 of subpixels in the horizontal direction X. Thus, it may be appreciated that the area ratio in the vertical direction is 121% of the area ratio of the horizontal direction X and the capacitance value Cm is 0.506 pF.

Here, the horizontal edge area 114 has a flat planar structure substantially the same as that of the inner area 112, such that the capacitance Cm of the horizontal edge area 114 has substantially no difference from that of the inner area 112.

In contrast, since the left and right end portions of the display panel 110 are rounded with a curvature, the vertical edge area 116 is configured such that the number of subpixels in the horizontal direction X is 60, which is smaller than the number 66 of subpixels in the vertical direction Y.

As a result, the area ratio of the vertical edge area 116 is 90%, and the distances from the touch electrodes TE and the touch lines TL to the second electrode layer L13 decrease in the direction toward the left edge or the right edge.

In this structure, a portion of electric charge delivered from the driving electrodes or the driving lines Tx to the sensing electrodes or sensing lines Rx enters the adjacent second electrode layer L13 thereto, thereby lowering the capacitance Cm of the touch electrodes TE. In a case in which the vertical edge area 116 has the area ratio 90%, i.e. the area in the horizontal direction X is 90% of the area in the vertical direction Y, it may be appreciated that the capacitance Cm detected from the sensing lines Rx is significantly reduced to 0.465 pF.

In addition, in the corner area 118, the number of subpixels in the horizontal direction X is reduced to 60 as in the case of the vertical edge area 116, and the number of subpixels in the vertical direction Y is increased to 78. As a result, the capacitance Cm is further reduced to 0.419 pF.

This is because the distances from the touch electrodes TE and the touch lines TL to the second electrode layer L13 decrease in the direction toward the left and right edges and the corners, and the area ratio of the touch electrodes TE in the horizontal direction X with respect to the vertical direction Y is changed.

In order to solve this problem, the touch display device 100 according to the present disclosure applies the touch driving signal to the touch electrodes TE disposed in the rounded edge areas 114 and 116 and the rounded corner area 118 at a voltage level higher than that of the touch driving signal applied to the inner area 112, thereby increasing the touch sensing signal.

As a result, a decrease in the area ratio or the capacitance Cm in the edge areas 114 and 116 and the corner area 118 is reduced, thereby improving the signal-to-noise ratio (SNR) of the touch sensing signal.

Figure 8:
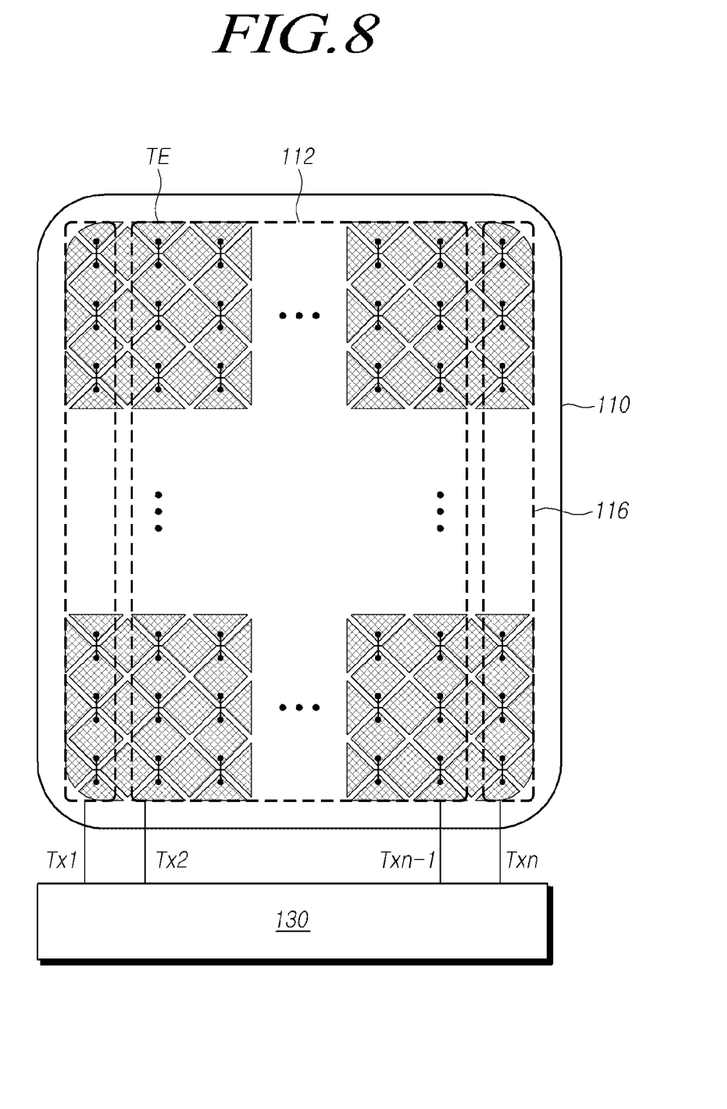
FIG. 8 is a plan view illustrating the display panel applying the touch driving signal variously according to the area in the touch display device according to the present disclosure.

FIG. 8 is a plan view illustrating the display panel applying the touch driving signal variously according to the area in the touch display device according to the present disclosure.

Referring to FIG. 8, the touch display device 100 according to the present disclosure includes the display panel 110 in which the plurality of touch electrodes TE and the plurality of touch lines TL are disposed and the touch circuit 130 outputting the touch driving signal to the touch electrodes TE and receiving the touch sensing signal from the touch electrodes TE.

The plurality of touch electrodes TE are connected to the touch circuit 130 through the touch lines TL. The touch lines TL may include the driving lines Tx, through which the touch driving signal output from the touch circuit 130 is applied to the touch electrodes TE, and the sensing lines Rx delivering the touch sensing signal from the touch circuit 130. Among the driving lines Tx and the sensing lines Rx, the driving lines Tx are only illustrated in FIG. 8.

In this structure, the display panel 110 extends in the vertical direction, and the rounded edge areas 116 extend vertically on the left and right peripheral portions. The driving lines Tx delivering the touch driving signal are arranged vertically along the vertical edge areas 116 of the display panel 110.

The driving lines Tx and the sensing lines Rx may vary depending on the shape or structure of the display panel 110. However, for applying the touch driving signal to the touch electrodes TE, disposed in the vertical edge areas 116 to improve the touch sensitivity of the vertical edge areas 116, at a voltage level different from that of the touch driving signal applied to the inner area 112, it may be effective that the driving lines Tx are provided in a direction parallel to the vertical edge areas 116 having a rounded shape.

That is, in a case in which the rounded edge areas are the vertical edge areas 116, the driving lines Tx may be provided in a direction parallel to the vertical edge areas 116. In addition, in a case in which the rounded edge areas are the horizontal edge areas 114, the driving lines Tx may be provided in a direction parallel to the horizontal edge areas 114.

In contrast, in a case in which the direction of the rounded edge area is not parallel to the direction of the driving lines Tx, at points in time at which the scan signal SCAN is applied to the touch electrodes TE located in the edge areas, points in time at which the touch driving signal is applied may be adjusted so that the touch driving signal having a higher voltage level is applied to the corresponding touch electrodes TE.

That is, a touch driving signal output circuit provided in the touch circuit 130 sequentially outputs the touch driving signal to the plurality of touch electrodes TE through the driving lines Tx in the touch sensing period. A touch sensing signal receiver circuit in the touch circuit 130 receives the touch sensing signal, delivered from the plurality of touch electrodes TE, through the sensing lines Rx.

Here, the voltage of the touch driving signal applied to the touch electrodes TE disposed in the inner area 112 and the voltage of the touch driving signal applied to the touch electrodes TE disposed in the horizontal edge areas 116 may be adjusted to be different from each other. That is, the magnitude of the touch driving signal applied to driving lines Tx1 and Txn corresponding to the vertical edge areas 116 may be different from the magnitude of the touch driving signal applied to driving lines Tx2, . . . , and Txn−1 corresponding to the inner area 112.

The touch sensitivity of the vertical edge areas 116 may be improved as described above to reduce or remove deviations in the capacitance occurring in the inner area 112 and the vertical edge areas 116, so that the entire area of the display panel 110 may have uniform touch performance.

In FIG. 8, the driving line Tx1 corresponding to the left vertical edge area 116 is illustrated as a single line, and the driving line Txn corresponding to the right vertical edge area 116 is illustrated as a single line. Alternatively, two or more driving lines Tx may correspond to each of the vertical edge areas 116.

Figure 9:
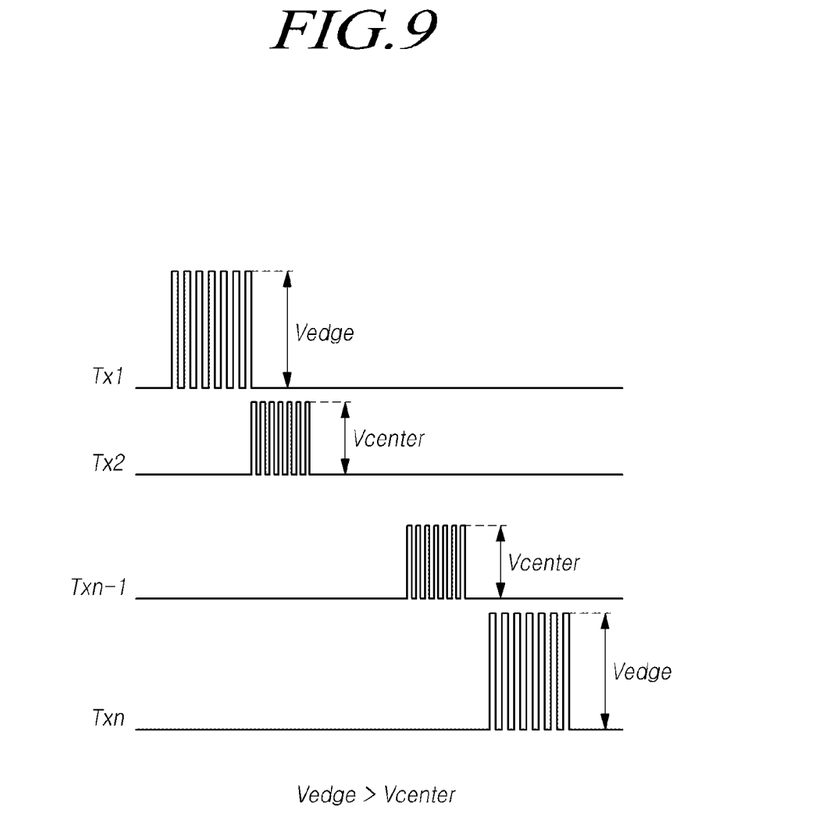
FIG. 9 is a timing diagram of the touch driving signal applied to different areas in the touch display device according to the present disclosure.

FIG. 9 is a timing diagram of the touch driving signal applied to different areas in the touch display device according to the present disclosure.

Referring to FIG. 9, in the touch display device 100 according to the present disclosure, the scan signal for the display driving may be sequentially output to the gate lines GL disposed in the display panel 110.

In addition, the touch driving signal for the touch sensing provided from the display panel 110 may be sequentially applied through the driving lines Tx disposed parallel to the data lines DL.

Here, a touch driving signal voltage Vedge of the vertical edge areas applied through the driving lines Tx1 and Txn connected to the touch electrodes of the vertical edge areas 116 may have a higher level than a touch driving signal voltage Vcenter of the inner area 112 applied through the driving lines Tx2, . . . , and Txn−1 connected to the touch electrodes of the inner area 112.

That is, in a case in which the vertical edge areas 116 of the display panel 110 has a rounded shape, the touch driving signal voltage Vedge applied to the vertical edge areas 116 is provided to be higher than the touch driving signal voltage Vcenter applied to the inner area 112 in order to compensate for a decrease in the capacitance due to a decrease in the distances from the touch electrodes TE and the touch lines TL to the second electrode layer L13.

Since the touch driving signal applied to the vertical edge areas 116 having the rounded shape has a higher level than the touch driving signal applied to the inner area 112 as described above, differences in the capacitance Cm occurring in the inner area 112 and the vertical edge areas 116 may be removed or reduced, so that the entire area of the display panel 110 may have uniform touch performance.

Figure 10:
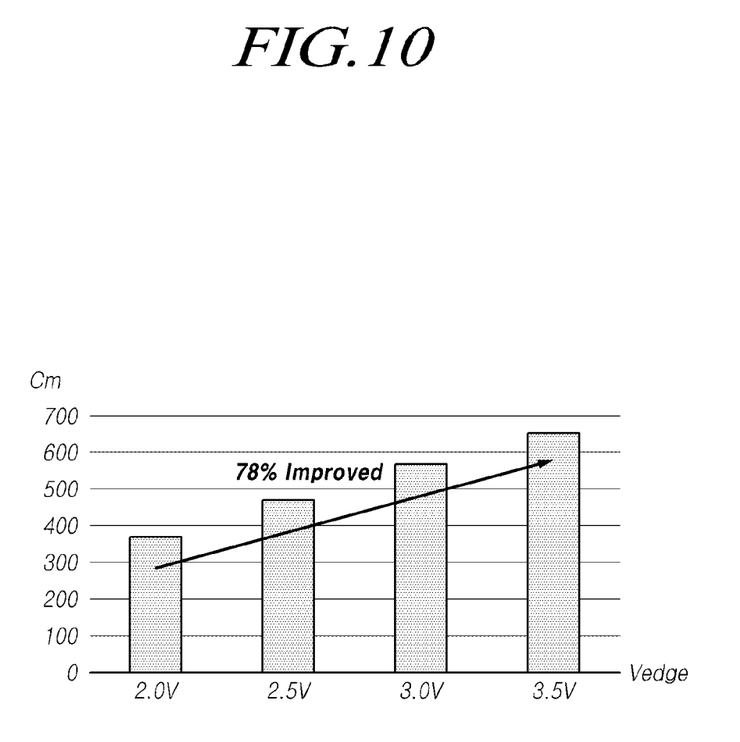
FIG. 10 is a graph illustrating capacitance changes depending on the voltage of the touch driving signal applied to the touch electrodes in the edge area in the touch display device according to the present disclosure.

FIG. 10 is a graph illustrating capacitance changes depending on the voltage of the touch driving signal applied to the touch electrodes in the edge area in the touch display device according to the present disclosure.

Referring to FIG. 10, in the touch display device according to the present disclosure, in a case in which the voltage level of the touch driving signal applied to the inner area 112 is 2.0V and the voltage level of the touch driving signal applied to the vertical edge areas 116 is increased from 2.0V to 3.5V with an increment of 0.5V, capacitance changes may be observed in the vertical edge areas 116.

That is, comparing to a case in which the touch driving signal having the same voltage level of 2.0V is applied to the inner area 112 and the vertical edge areas 116, in a case in which the touch driving signal having a voltage level of 3.5V is applied to the vertical edge areas 116, an improvement of about 78% in relation to the capacitance in the vertical edge areas 116 may be confirmed.

Here, comparing the touch driving signal applied to the inner area 112, the voltage level of the touch driving signal applied to the vertical edge areas 116 may vary depending on the power source used within the touch display device 100 determined according to the type of the touch display device 100, the shape of the vertical edge areas 116, and the arrangement of the touch electrodes in the vertical edge areas 116. In addition, the voltage level of the touch driving signal applied to the vertical edge areas 116 may be determined in consideration of the ratio of the capacitance Cm measured in the inner area 112 and the capacitance Cm measured in the vertical edge areas 116.

For example, the voltage level of the touch driving signal applied to the vertical edge areas 116 may be determined within the range not exceeding two times the voltage level of the touch driving signal applied to the inner area 112.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the present disclosure disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A touch display device comprising:
   a display panel including an edge area having a rounded shape and a flat inner area in which a plurality of touch electrodes are disposed, wherein a distance from the plurality of touch electrodes to a cathode of a light-emitting diode in the edge area is shorter than a distance from the plurality of touch electrodes to a cathode of a light-emitting diode in the flat inner area;
   a plurality of driving lines applying touch driving signal to the plurality of touch electrodes; and
   a touch circuit outputting the touch driving signal applied to the edge area at a voltage level higher than a voltage level of the touch driving signal applied to the flat inner area to compensate a capacitance based on the distance from the plurality of touch electrodes to the cathode of the light-emitting diode in the edge area.

2. The touch display device according to claim 1, wherein the edge area includes at least one of a top horizontal line, a bottom horizontal line, a left vertical line and a right vertical line of the display panel.

3. The touch display device according to claim 1, wherein the driving lines extend in parallel to a direction in which the edge area extends.

4. The touch display device according to claim 1, wherein the voltage level of the touch driving signal applied to the edge area is determined in consideration of at least one selected from among the shape of the edge area, an arrangement of the touch electrodes in the edge area, and a difference in capacitance between the flat inner area and the edge area.

5. The touch display device according to claim 1, wherein the voltage level of the touch driving signal applied to the edge area is equal to or smaller than two times the voltage level of the touch driving signal applied to the flat inner area.

6. The touch display device according to claim 1, wherein the plurality of driving lines are different from a plurality of sensing lines, through which a touch sensing signal from the plurality of electrodes is delivered to the touch circuit.

7. The touch display device according to claim 1, wherein the plurality of driving lines are same as a plurality of sensing lines, through which a touch sensing signal from the plurality of electrodes is delivered to the touch circuit.

8. The touch display device according to claim 1, wherein, at a point in time at which a scan signal is applied to a gate line disposed at the display panel, the touch circuit outputs the touch driving signal to the corresponding touch electrodes disposed at the edge area among the plurality of touch electrodes.

9. The touch display device according to claim 1, further comprising an encapsulation layer in the display panel, and
   wherein the touch electrodes and the driving lines are disposed on the encapsulation layer.

10. A method of driving a touch display device, the method comprising:
    sequentially outputting a scan signal to a display panel along a plurality of gate lines,
    wherein the display panel includes an edge area having a rounded shape and a flat inner area in which a plurality of touch electrodes are disposed, and a plurality of driving lines applying touch driving signals to the plurality of touch electrodes are disposed in the display panel,
    wherein a distance from the plurality of touch electrodes to a cathode of a light-emitting diode in the edge area is shorter than a distance from the plurality of touch electrodes to a cathode of a light-emitting diode in the flat inner area; and
    outputting the touch driving signal applied to the edge area at a voltage level higher than a voltage level of the touch driving signal applied to the flat inner area to compensate a capacitance based on the distance from the plurality of touch electrodes to the cathode of the light-emitting diode in the edge area.

11. The method according to claim 10, wherein the voltage level of the touch driving signal applied to the edge area is determined in consideration of at least one of a shape of the edge area, an arrangement of the touch electrodes in the edge area, and a difference in capacitance between the flat inner area and the edge area.

12. The method according to claim 10, wherein the voltage level of the touch driving signal applied to the edge area is equal to or smaller than two times the voltage level of the touch driving signal applied to the flat inner area.

13. The method according to claim 10, wherein the plurality of driving lines are different from a plurality of sensing lines, through which a touch sensing signal from the plurality of electrodes is delivered to the touch circuit.

14. A touch circuit comprising:
a touch driving signal output circuit outputting a touch driving signal to a display panel including an edge area having a rounded shape and a flat inner area in which a plurality of touch electrodes are disposed, wherein a distance from the plurality of touch electrodes to a cathode of a light-emitting diode in the edge area is shorter than a distance from the plurality of touch electrodes to a cathode of a light-emitting diode in the flat inner area;
a plurality of driving lines applying the touch driving signal to the plurality of touch electrodes being disposed in the display panel, such that the touch driving signal applied to the edge area has a voltage level higher than a voltage level of the touch driving signal applied to the flat inner area to compensate a capacitance based on the distance from the plurality of touch electrodes to the cathode of the light-emitting diode in the edge area; and
a touch sensing signal receiver circuit receiving a touch sensing signal delivered from the plurality of touch electrodes along sensing lines to detect a touch and determine touch coordinates.

15. The touch circuit according to claim 14, wherein the driving lines extend in parallel to a direction in which the edge area extends.

16. The touch circuit according to claim 14, wherein the voltage level of the touch driving signal applied to the edge area is determined in consideration of at least one of a shape of the edge area, an arrangement of the touch electrodes in the edge area, and a difference in capacitance between the flat inner area and the edge area.

17. The touch circuit according to claim 14, wherein the voltage level of the touch driving signal applied to the edge area is equal to or smaller than two times the voltage level of the touch driving signal applied to the flat inner area.

18. The touch circuit according to claim 14, wherein the plurality of driving lines are different from the plurality of sensing lines.

19. The touch circuit according to claim 14, wherein the plurality of driving lines are same as the sensing lines.

20. The touch circuit according to claim 14, wherein, at a point in time at which a scan signal is applied to a gate line disposed at the display panel, the touch driving signal output circuit outputs the touch driving signal to the corresponding touch electrodes disposed at the edge area among the plurality of touch electrodes.

\* \* \* \* \*